United States Patent
Fujimori

(10) Patent No.: US 10,401,419 B2
(45) Date of Patent: Sep. 3, 2019

(54) FAILURE DETECTION CIRCUIT, FAILURE DETECTION SYSTEM AND FAILURE DETECTION METHOD

(71) Applicant: Kabushiki Kaisha Toshiba, Minato-ku, Tokyo (JP)

(72) Inventor: Masafumi Fujimori, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 183 days.

(21) Appl. No.: 15/683,156

(22) Filed: Aug. 22, 2017

(65) Prior Publication Data
US 2018/0267095 A1    Sep. 20, 2018

(30) Foreign Application Priority Data

Mar. 17, 2017 (JP) ................... 2017-053381

(51) Int. Cl.
*G01R 31/26* (2014.01)
*H03K 5/24* (2006.01)
*H03K 19/20* (2006.01)

(52) U.S. Cl.
CPC ........... *G01R 31/2607* (2013.01); *H03K 5/24* (2013.01); *H03K 19/20* (2013.01)

(58) Field of Classification Search
CPC . G01R 31/26; G01R 31/2601; G01R 31/2607
See application file for complete search history.

(56) References Cited

U.S. PATENT DOCUMENTS

| | | | | |
|---|---|---|---|---|
| 7,358,718 B2* | 4/2008 | Fujieda | ............ | G01R 31/3008 324/750.3 |
| 7,592,797 B2* | 9/2009 | Fujieda | ............ | G01R 31/3008 324/750.01 |
| 8,093,919 B2* | 1/2012 | Mizuno | ............ | G01R 31/3187 324/762.01 |
| 8,115,507 B2* | 2/2012 | Mizuno | ............ | G01R 31/31703 324/762.01 |
| 2011/0288807 A1 | 11/2011 | Iwase et al. | | |

FOREIGN PATENT DOCUMENTS

| | | |
|---|---|---|
| JP | 2009-264948 A | 11/2009 |
| JP | 2011-243263 A | 12/2011 |
| JP | 2015-158414 A | 9/2015 |

* cited by examiner

*Primary Examiner* — Walter L Lindsay, Jr.
*Assistant Examiner* — Milton Gonzalez
(74) *Attorney, Agent, or Firm* — White & Case LLP

(57) ABSTRACT

A data failure detection circuit of embodiments includes a monitor signal generation circuit configured to generate a monitor signal to be used to sense failures of a plurality of test mode signals to be respectively input to a plurality of modules, a cascade connection circuit configured to sense a failure of each of the test mode signals and including a plurality of OR circuits, and a comparison circuit configured to compare an output signal from the cascade connection circuit with the monitor signal to determine whether or not a failure exists. In the cascade connection circuit, a plurality of OR circuits are connected in cascade, and the monitor signal is input to one of the OR circuits in a first stage.

20 Claims, 6 Drawing Sheets

FAILURE DETECTION CIRCUIT, FAILURE DETECTION SYSTEM AND FAILURE DETECTION METHOD

CROSS-REFERENCE TO RELATED APPLICATION

This application is based upon and claims the benefit of priority from the prior Japanese Patent Application No. 2017-053381 filed on Mar. 17, 2017; the entire contents of which are incorporated herein by reference.

FIELD

Embodiments described herein relate generally to a failure detection circuit, a failure detection system and a failure detection method.

BACKGROUND

In recent years, in accordance with development of a process technology, a semiconductor device has been made more highly integrated, and a system LSI such as an SoC (system on a chip) on which a number of modules are mounted on one semiconductor device has been in widespread use. In such a semiconductor device, various kinds of operation performance are tested in an inspection step performed in a last stage of a manufacturing process. Only a good item which passes the test is shipped as a product.

When an operation performance test is performed, a low-level (or high-level) fixed signal is input to each module as a test mode signal. Further, when normal operation is performed, a fixed signal having an opposite phase to a phase upon test is input as the test mode signal. That is, in the case where the test mode signal upon test is a low-level fixed signal, a high-level fixed signal is input during normal operation. Further, in the case where the test mode signal upon test is a high-level fixed signal, a low-level fixed signal is input during normal operation.

Conventionally, by inputting a test mode signal to be input to each module to an OR circuit or a NAND circuit, a failure of a test mode signal (unintended test mode state) during normal operation is detected. For example, in the case where a high-level fixed signal is input to each module as a test mode signal upon implementation of the test, all the test mode signals are also input to the OR circuit. During normal operation in a normal state, because all the test mode signals become low-level fixed signals, a low-level signal is output from the OR circuit. However, in the case where an abnormality occurs in the test mode signal and at least one module to which a high-level fixed signal is input exists, a high-level signal is output from the OR circuit.

However, in such a conventional configuration, there is a problem that, in the case where the OR circuit (or the NAND circuit) itself used as a failure detection circuit fails, and, for example, a low-level fixed signal is always output regardless of a level of the input signal, even if an abnormality occurs in the test mode signal, a failure cannot be detected.

DETAILED DESCRIPTION

A failure detection circuit of the present embodiment includes a monitor signal generation circuit configured to generate a monitor signal to be used to sense failures of a plurality of test mode signals respectively input to a plurality of modules, a cascade connection circuit configured to sense failures of the respective test mode signals and equipped with a plurality of failure sensing circuits, and a comparison circuit configured to compare an output signal from the cascade connection circuit with the monitor signal to determine whether or not a failure exists. In the cascade connection circuit, the plurality of failure sensing circuits are connected in cascade, and the monitor signal is input to the failure sensing circuit in the first stage.

Embodiments will be described below with reference to the drawings.

First Embodiment

Figure 1:
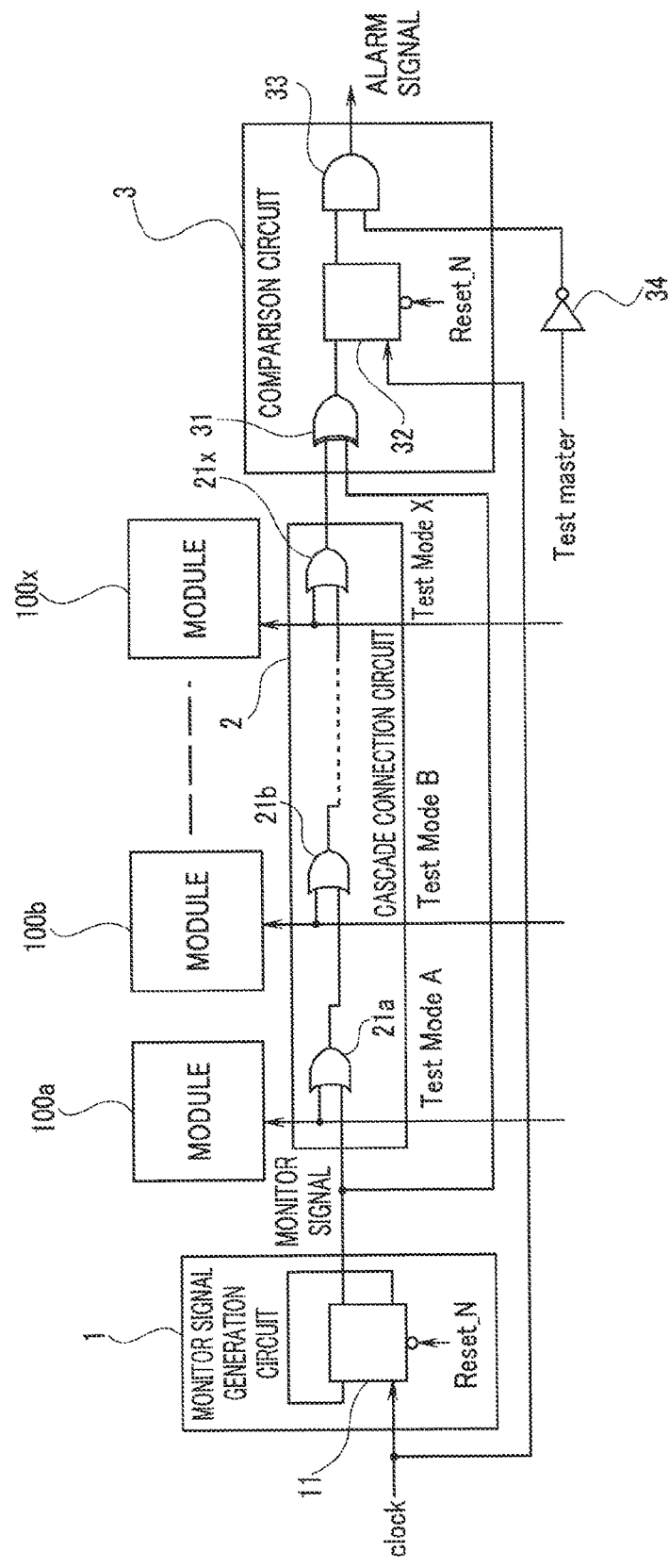
FIG. 1 is a schematic block diagram illustrating a configuration of a failure detection circuit according to a first embodiment of the present invention.

FIG. 1 is a schematic block diagram illustrating a configuration of a failure detection circuit according to a first embodiment of the present invention. The failure detection circuit of the present embodiment is mainly configured with a monitor signal generation circuit 1, a cascade connection circuit 2 and a comparison circuit 3.

The monitor signal generation circuit 1 has a latch circuit 11. The latch circuit 11 generates and outputs a monitor signal which repeatedly switches between a high level and a low level in a predetermined period based on a clock signal input from outside.

The cascade connection circuit 2 has OR circuits 21*a*, 21*b*, ..., 21*x* of the same number as the number of modules to be tested. Each of the OR circuits 21*a*, 21*b*, ..., 21*x* is a circuit which detects a failure of a test mode signal input to the corresponding module. To the OR circuit 21*a*, the monitor signal output from the monitor signal generation circuit 1, and a test mode signal (test mode signal to be input to the module 100*a*) for which a failure is to be detected are input, and a detection result is output.

To the OR circuit 21*b*, a detection result of the OR circuit 21*a*, and a test mode signal (test mode signal to be input to the module 100*b*) for which a failure is to be detected are input, and a detection result is output. In a similar manner, by repeatedly inputting output of a detection result from the OR circuit 21 in the previous stage and a test mode signal to be input to the corresponding module 100 to the OR circuit 21 in the next stage, all the OR circuits 21 are connected in cascade. An output signal of the OR circuit 21*x* disposed in the last stage is input to the comparison circuit 3.

Note that, in the present embodiment, to each of the modules 100*a*, 100*b*, ..., 100*x*, a test mode signal which is a high-level fixed signal upon implementation of the test, and which is a low-level fixed signal during normal operation, is input. Therefore, in the case where the test mode signal is a normal value, during normal operation, a signal input from the OR circuit 21 in the previous stage is output as is. Because a signal input to the OR circuit 21a which is disposed in the first stage is a monitor signal, in the case where test mode signals input to all the modules 100 are normal (in the case where the test mode signals are low-level fixed signals), a signal having the same waveform as a waveform of the monitor signal is output from the OR circuit 21x disposed in the last stage.

On the other hand, in the case where the test mode signal is abnormal, a signal having a waveform different from a waveform of an output signal of the OR circuit 21 in the previous stage is output from the OR circuit 21 to which the abnormal test mode signal is input. For example, in the case where the test mode signal is a high-level fixed signal although the state is a normal operation state, a high-level fixed signal is output from the OR circuit 21 to which an abnormal test mode signal is input. Note that, even if the test mode signal is normal, also in the case where the OR circuit 21 itself fails and does not output a correct value, a signal having a waveform different from the waveform of an output signal of the OR circuit 21 in the previous stage is output. When the OR circuit 21 fails, for example, a high-level or low-level fixed signal is output regardless of a value of the input signal.

In the cascade connection circuit 2, a monitor signal input to the OR circuit 21a in the first stage is propagated through subsequent OR circuit 21 and output as a detection result. On the other hand, in the case where a failure is detected at any of the OR circuits 21, the OR circuit 21 subsequent to the circuit propagates a signal having a waveform different from the waveform of the monitor signal (for example, a high-level fixed signal) and outputs the signal as a detection result.

The comparison circuit 3 includes an EXOR circuit 31, a latch circuit 32 and an AND circuit 33. To the EXOR circuit 31, the monitor signal output from the monitor signal generation circuit 1, and an output signal from the cascade connection circuit 2 are input. In the case where a failure is not detected at the cascade connection circuit 2, and a signal having the same waveform as the waveform of the monitor signal is output, two input signals to the EXOR circuit 31 become always the same value. Therefore, a low-level fixed signal is output from the EXOR circuit 31.

On the other hand, in the case where a failure is detected at the cascade connection circuit 2, and a signal having a waveform different from the waveform of the monitor signal is output from the cascade connection circuit 2, there exists a period where the two input signals to the EXOR circuit 31 are the same and a period where the two input signals are different. For example, in the case where a high-level fixed signal is output from the cascade connection circuit 2, a signal in which a high level and a low level are repeated in the same period as a period of the monitor signal is output from the EXOR circuit 31.

The latch circuit 32 fixes a period of a signal input from the EXOR circuit 31 based on a clock signal input from outside.

To the AND circuit 33, an output signal from the latch circuit 32, and a signal for identifying whether a state is a test implemented state or a normal operation state (a test master signal: a high-level fixed signal is output in the test implemented state, while a low-level fixed signal is output in a normal operation state) is input via an inverter 34. That is, because, upon implementation of the test, to the AND circuit 33, a low-level fixed signal is input as the test master signal, a low-level fixed signal is always output as an alarm signal. On the other hand, in a normal operation state, a high-level fixed signal is input to the AND circuit 33 as the test master signal. Therefore, the output signal from the latch circuit 32 is output as the alarm signal.

Note that, because the latch circuit 32 and the AND circuit 33 are not essential components of the comparison circuit 3, the latch circuit 32 and the AND circuit 33 can be omitted.

Figure 2:
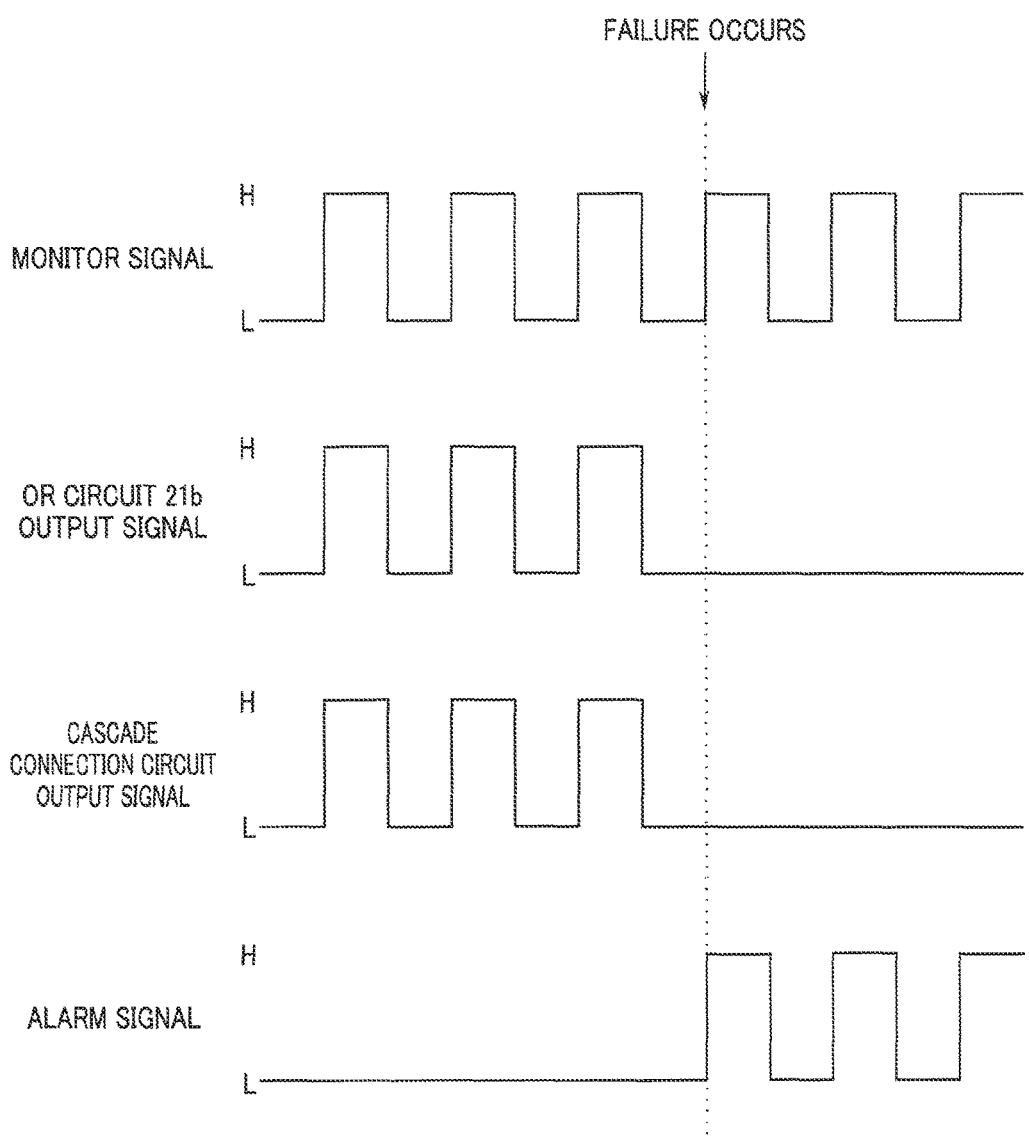
FIG. 2 is a timing chart explaining a failure detection method of the failure detection circuit in the first embodiment.

Operation of the failure detection circuit of the present embodiment will be described next. FIG. 2 is a timing chart explaining a failure detection method of the failure detection circuit in the first embodiment. Note that failure detection in the present embodiment refers to detection of a failure of the test mode signal in the normal operation state and a failure of the OR circuit 21 itself which is the failure detection circuit. First, a clock signal is input to the monitor signal generation circuit 1, and a monitor signal which repeatedly switches between a high level and a low level in a predetermined period is output.

In the case where operation is normally performed, a signal having the same waveform as the waveform of the monitor signal is output from each of the OR circuits 21a, 21b, . . . , 21x of the cascade connection circuit 2. FIG. 2 illustrates a waveform of the OR circuit 21b as a typical example of the OR circuit 21. The OR circuits 21a, 21b, . . . , 21x are connected in cascade so that output of the OR circuit 21 in the previous stage is input to the subsequent OR circuit 21. Therefore, in the case where all the test mode signals are normal, and all the OR circuits 21a, 21b, . . . , 21x normally operate (in the case of a low-level fixed signal), a signal having the same waveform as the waveform of the monitor signal is output from the OR circuit 21x disposed in the last stage (cascade connection circuit output signal in FIG. 2).

To the EXOR circuit 31 of the comparison circuit 3, the monitor signal generated at the monitor signal generation circuit 1 and the cascade connection circuit output signal are input. In the case where the cascade connection circuit output signal and the monitor signal have the same waveform, a low-level fixed signal is output from the EXOR circuit 31. The low-level fixed signal output from the EXOR circuit 31 is output from the comparison circuit 3 through the latch circuit 32 and the AND circuit 33 as an alarm signal.

Here, at certain time, if a failure occurs at the OR circuit 21b itself, and a low-level fixed signal is always output, the output signal of the OR circuit 21b is propagated through the OR circuit 21 which is connected in the subsequent stage. Then, as the cascade connection circuit output signal, the low-level fixed signal propagated through the OR circuit 21 is output.

While the monitor signal is a low level, because the value of the cascade connection circuit output signal is identical with the value of the monitor signal, the EXOR circuit 31 of the comparison circuit 3 outputs a low-level signal. However, while the monitor signal is a high level, because the value of the cascade connection circuit output signal is not identical with the value of the monitor signal, a high-level signal is output. That is, in the case where a failure occurs at the OR circuit 21b, a signal having the same waveform as the waveform of the monitor signal is output as the alarm signal.

Note that, in the case where a failure occurs at the test mode signal instead of a failure of the OR circuit 21 itself, and a fixed signal becomes a high level, a signal which has the same cycle and the same phase as the cycle and the phase of the monitor signal, and which has an opposite value to the value of the monitor signal (while the monitor signal is a high level, the signal is a low level, and while the monitor signal is a low level, the signal is a high level) is output as the alarm signal.

Further, also in the case where a failure occurs at the OR circuit 21b itself, and a high-level fixed signal is always output, a signal which has the same cycle and the same phase as the cycle and the phase of the monitor signal and which has an opposite value to the value of the monitor signal is output as the alarm signal.

In this manner, according to the present embodiment, in the case where a failure occurs at any of the plurality of OR circuits which are failure detection circuits, and a low-level (or high-level) fixed signal is always output, as well as in the case where a failure occurs at a test mode signal to be input to any of the modules, and a state becomes an unintended state (high-level fixed signal), a signal having a waveform different from the waveform of the monitor signal is output from the OR circuit. Because all the OR circuits are connected in cascade, an output signal of the OR circuit which detects a failure or where a failure occurs is propagated through the OR circuit connected in the subsequent stage and output from the OR circuit disposed in the last stage. Because a failure is detected by sensing whether or not a waveform of the cascade connection circuit output signal is identical with the waveform of the monitor signal, it is possible to also detect a failure of the failure detection circuit itself along with a failure of the test mode signal.

Second Embodiment

In the first embodiment, a failure of the test mode signal which is a high-level fixed signal upon implementation of the test, and which is a low-level fixed signal during normal operation is detected. On the other hand, the second embodiment is different from the first embodiment in that a failure of the test mode signal which is a low-level fixed signal upon implementation of the test, and which is a high-level fixed signal during normal operation is detected.

Figure 3:
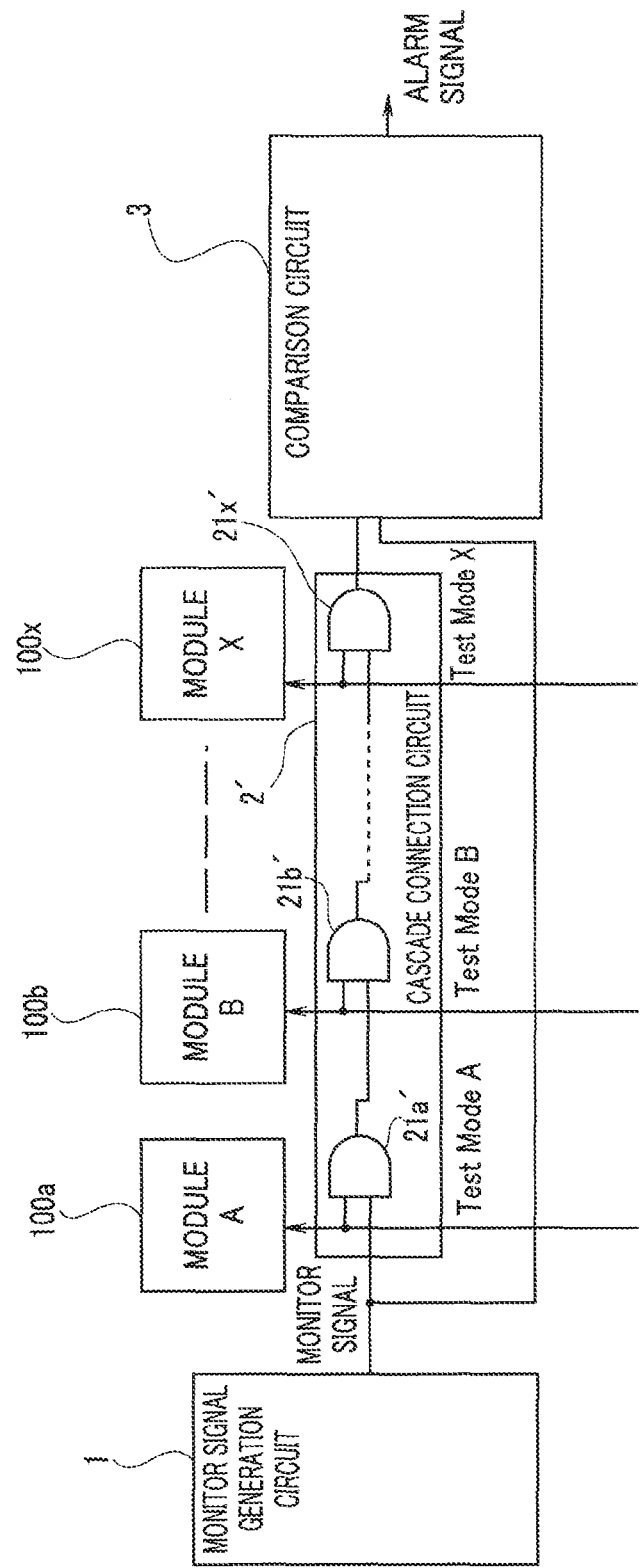
FIG. 3 is a schematic block diagram illustrating a configuration of a failure detection circuit according to a second embodiment.

FIG. 3 is a schematic block diagram illustrating a configuration of a failure detection circuit according to the second embodiment. The failure detection circuit of the present embodiment has a similar configuration to the configuration of the failure detection circuit of the first embodiment except that the configuration of the cascade connection circuit 2'. The same reference numerals are assigned to the same components, and detailed description will be omitted.

The cascade connection circuit 2' has AND circuits 21a', 21b', . . . , 21x' of the same number as the number of modules to be tested. Each of the AND circuits 21a', 21b', . . . , 21x' is a circuit which detects a failure of the test mode signal to be input to the corresponding module. The monitor signal output from the monitor signal generation circuit 1, and the test mode signal (test mode signal to be input to the module 100a) for which a failure is to be detected are input to the AND circuit 21a', and a detection result is output.

The detection result of the AND circuit 21a' and the test mode signal (test mode signal to be input to the module 100b) for which a failure is to be detected are input to the AND circuit 21b', and a detection result is output. In a similar manner, by repeatedly inputting output of a detection result from the AND circuit 21' in the previous stage and the test mode signal to be input to the corresponding module 100 to the AND circuit 21' in the next stage, all the AND circuits 21' are connected in cascade. The output signal of the AND circuit 21x' disposed in the last stage is input to the comparison circuit 3.

Figure 4:
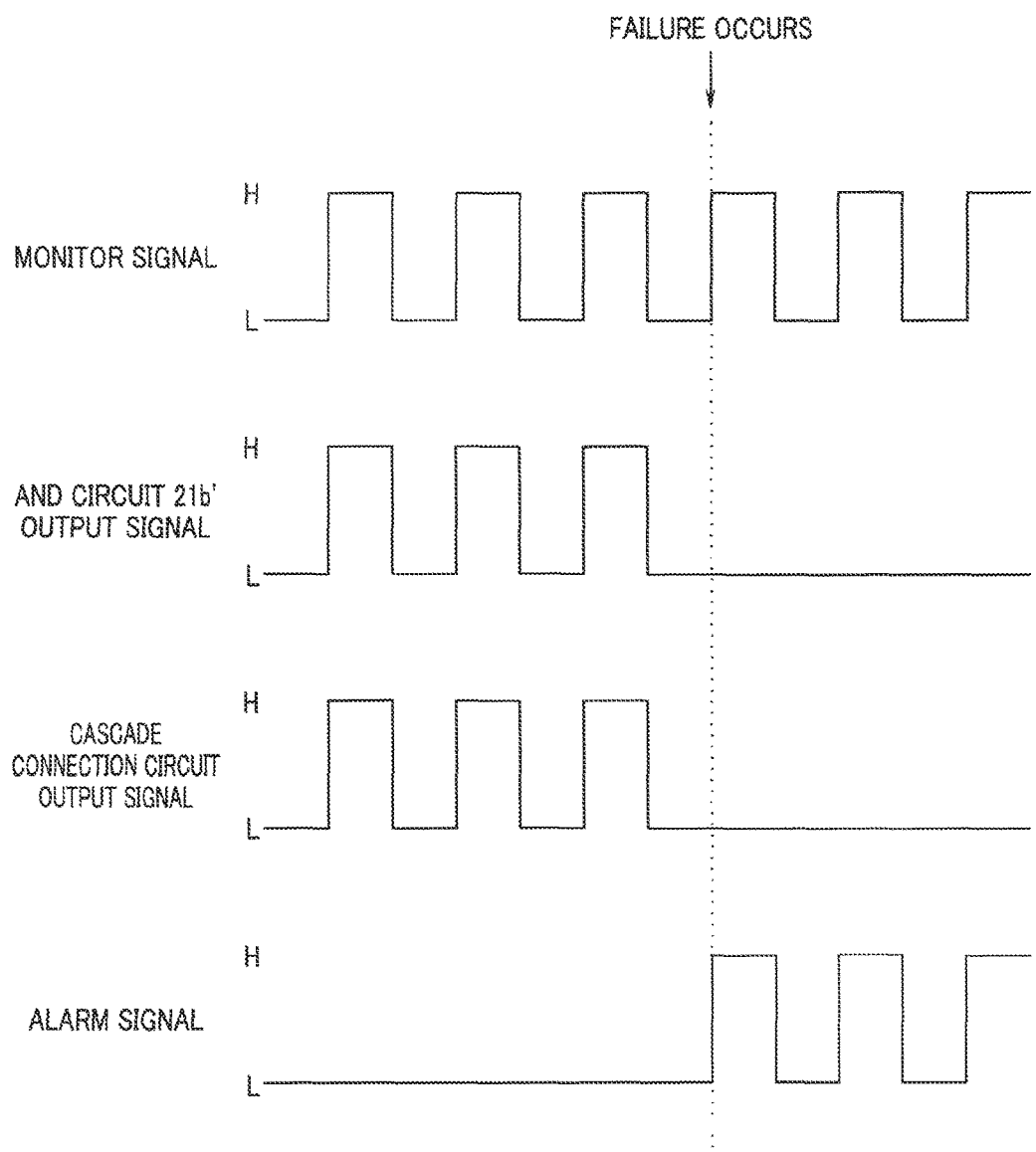
FIG. 4 is a timing chart explaining a failure detection method of the failure detection circuit in the second embodiment.

The operation of the failure detection circuit of the present embodiment will be described next. FIG. 4 is a timing chart explaining a failure detection method of the failure detection circuit in the second embodiment. Note that failure detection in the present embodiment refers to detection of a failure of a test mode signal in a normal operation state and a failure of the AND circuit 21' itself which is a failure detection circuit. First, a clock signal is input to the monitor signal generation circuit 1, and a monitor signal which repeatedly switches between a high level and a low level in a predetermined period is output.

In the case where operation is normally performed, a signal having the same waveform as the waveform of the monitor signal is output from each of the AND circuits 21a', 21b', . . . , 21x' of the cascade connection circuit 2. FIG. 4 illustrates a waveform of the AND circuit 21b' as a typical example of the AND circuit 21'. The AND circuits 21a', 21b' . . . . , 21x' are connected in cascade so that output of the AND circuit 21b' in the previous stage is input to the next AND circuit 21b'. Therefore, in the case where all the test mode signals are normal, and all the AND circuits 21a', 21b', . . . , 21x' normally operate (in the case of a high-level fixed signal), a signal having the same waveform as the waveform of the monitor signal is output from the AND circuit 21x' disposed in the last stage (cascade connection circuit output signal in FIG. 4).

To the EXOR circuit 31 of the comparison circuit 3, the monitor signal generated at the monitor signal generation circuit 1 and the cascade connection circuit output signal are input. In the case where the cascade connection circuit output signal and the monitor signal have the same waveform, a low-level fixed signal is output from the EXOR circuit 31. The low-level fixed signal output from the EXOR circuit 31 is output from the comparison circuit 3 through the latch circuit 32 and the AND circuit 33 as the alarm signal.

Here, if a failure occurs at the AND circuit 21b' itself at certain time, and a low-level fixed signal is always output, the output signal of the AND circuit 21b' is propagated through the AND circuit 21' connected in the subsequent stage. The low-level fixed signal propagated through the AND circuit 21' is output as the cascade connection circuit output signal.

Because the value of the cascade connection circuit output signal is identical with the value of the monitor signal while the monitor signal is a low level, the EXOR circuit 31 of the comparison circuit 3 outputs a low-level signal. However, because the value of the cascade output signal is not identical with the value of the monitor signal while the monitor signal is a high level, the EXOR circuit 31 outputs a high-level signal. That is, in the case where a failure occurs at the AND circuit 21b', a signal having the same waveform as the waveform of the monitor signal is output as the alarm signal.

Note that, also in the case where a failure occurs at the test mode signal instead of at the AND circuit 21' itself, and the output signal becomes a low-level fixed signal, a signal having the same waveform as the waveform of the monitor signal is output as the alarm signal.

Further, in the case where a failure occurs at the AND circuit 21b' itself, and a high-level fixed signal is always output, a signal which has the same cycle and the same phase as the cycle and the phase of the monitor signal and which has an opposite value to the value of the monitor signal is output as the alarm signal.

In this manner, according to the present embodiment, also in the case where a failure occurs at any of the plurality of AND circuits which are failure detection circuits, and a low-level (or high-level) fixed signal is always output as well as in the case where a failure occurs at the test mode signal to be input to any module, and the state becomes an unintended state (low-level fixed signal), a signal having a waveform different from the waveform of the monitor signal is output from the AND circuit. Because all the AND circuits are connected in cascade, an output signal of the AND circuit which detects a failure or where a failure occurs is propagated through the AND circuit connected in the subsequent stage, and output from the AND circuit disposed in the last stage. Because a failure can be detected by sensing whether or not the waveform of the cascade connection circuit output signal is identical with the waveform of the monitor signal, it is possible to also detect a failure of the failure detection circuit itself along with a failure of the test mode signal.

Third Embodiment

While the failure detection circuit of the first embodiment detects a failure of the test mode signal and the OR circuit which detects a failure of the test mode signal, the third embodiment is different from the first embodiment in that a failure of a wiring path from a test mode decoder which outputs the test mode signal to the module in addition to a failure of the test mode signal and the OR circuit.

Figure 5:
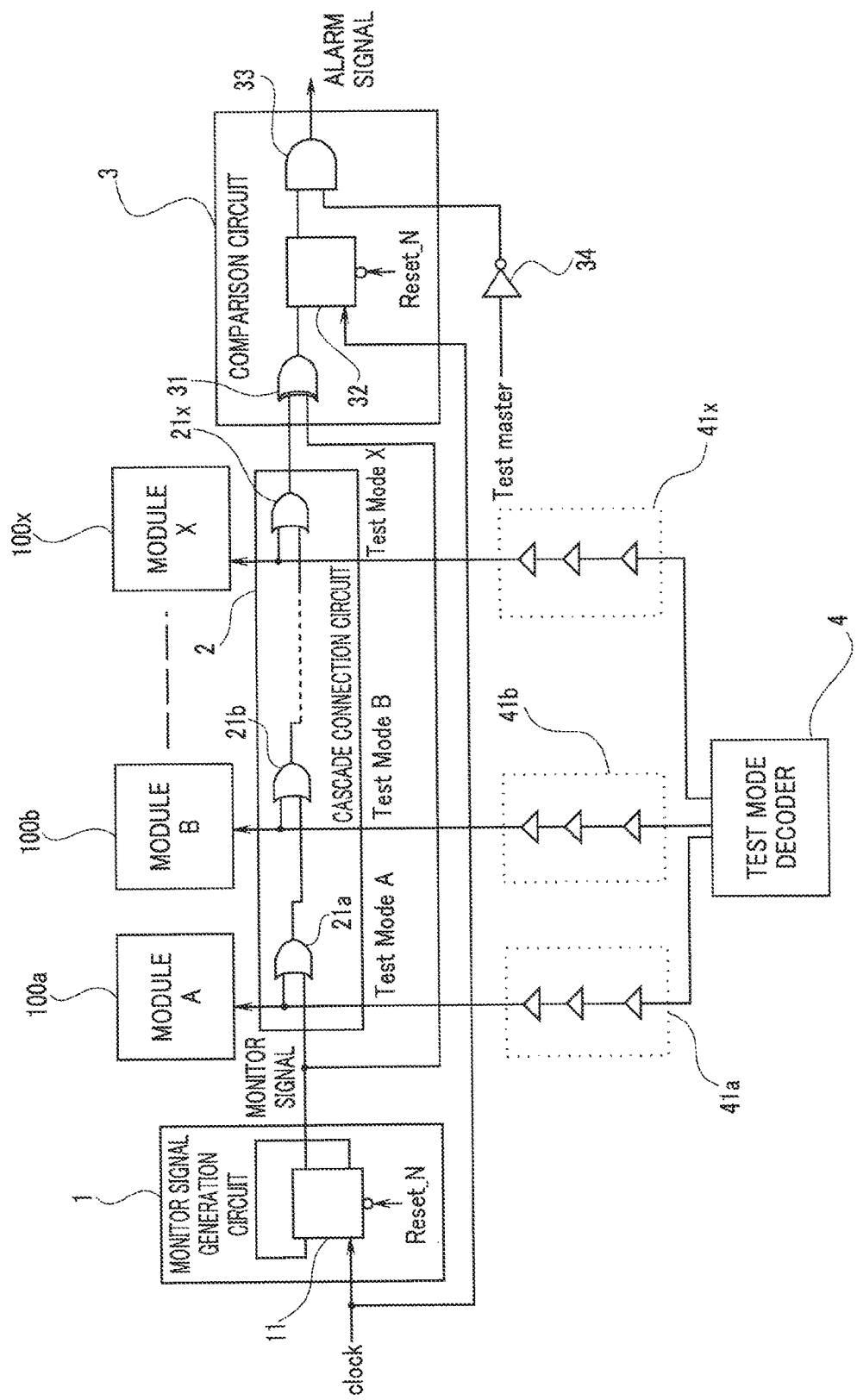
FIG. 5 is a schematic block diagram illustrating a configuration of a failure detection circuit according to a third embodiment.

FIG. 5 is a schematic block diagram illustrating a failure detection circuit according to the third embodiment. The failure detection circuit of the present embodiment has a similar configuration to the configuration of the failure detection circuit of the first embodiment except that a test mode decoder 4 is added. The same reference numerals are assigned to the same components, and detailed description will be omitted.

A test mode signal to be input to each of the modules 100a, 100b, . . . , 100x is generated at the test mode decoder 4. Normally, the test mode decoder 4 is laid out at a position remote from the module 100. Therefore, to prevent signal propagation delay, repeat buffers 41a, 41b, . . . , 41x are inserted at intermediate portions of wirings connecting the test mode decoder 4 and the respective modules 100a, 100b, . . . , 100x.

In the conventional failure detection circuit, all the test mode signals to be input to the respective modules 100a, 100b, . . . , 100x are input to the failure determination circuit (OR circuit) in a bundle. If the failure determination circuit is disposed in the vicinity of the module 100, because a wiring length from the test mode decoder 4 to the failure determination circuit becomes long, wiring efficiency degrades. Therefore, the failure determination circuit is disposed in the vicinity of the test mode decoder 4. However, in the case of such disposition, it is impossible to detect failures of wirings connecting the test mode decoder and the respective modules 100a, 100b, . . . , 100x and failures of repeat buffers 41a, 41b, . . . , 41x inserted at intermediate portions of the wirings.

On the other hand, in the failure detection circuit of the present embodiment illustrated in FIG. 4, the OR circuits 21 which detect failures of respective test mode signals are connected in cascade. Therefore, if the failure determination circuit is disposed in the vicinity of the module 100, because wiring lengths from the test mode decoder 4 to the respective OR circuits 21 do not become long as in the conventional failure detection circuit, the cascade connection circuit 2 can be laid out in the vicinity of the modules 100a, 100b, . . . , 100x. Accordingly, because repeat buffers 41a, 41b, . . . , 41x are disposed between the test mode decoder 4 and the cascade connection circuit 2, it is possible to also detect a failure in a wiring path (including the repeat buffers 41a, 41b, . . . , 41x) from the test mode decoder 4 to the module 100, in addition to a failure of the test mode signal and a failure of the OR circuit at the failure detection circuit.

Figure 6:
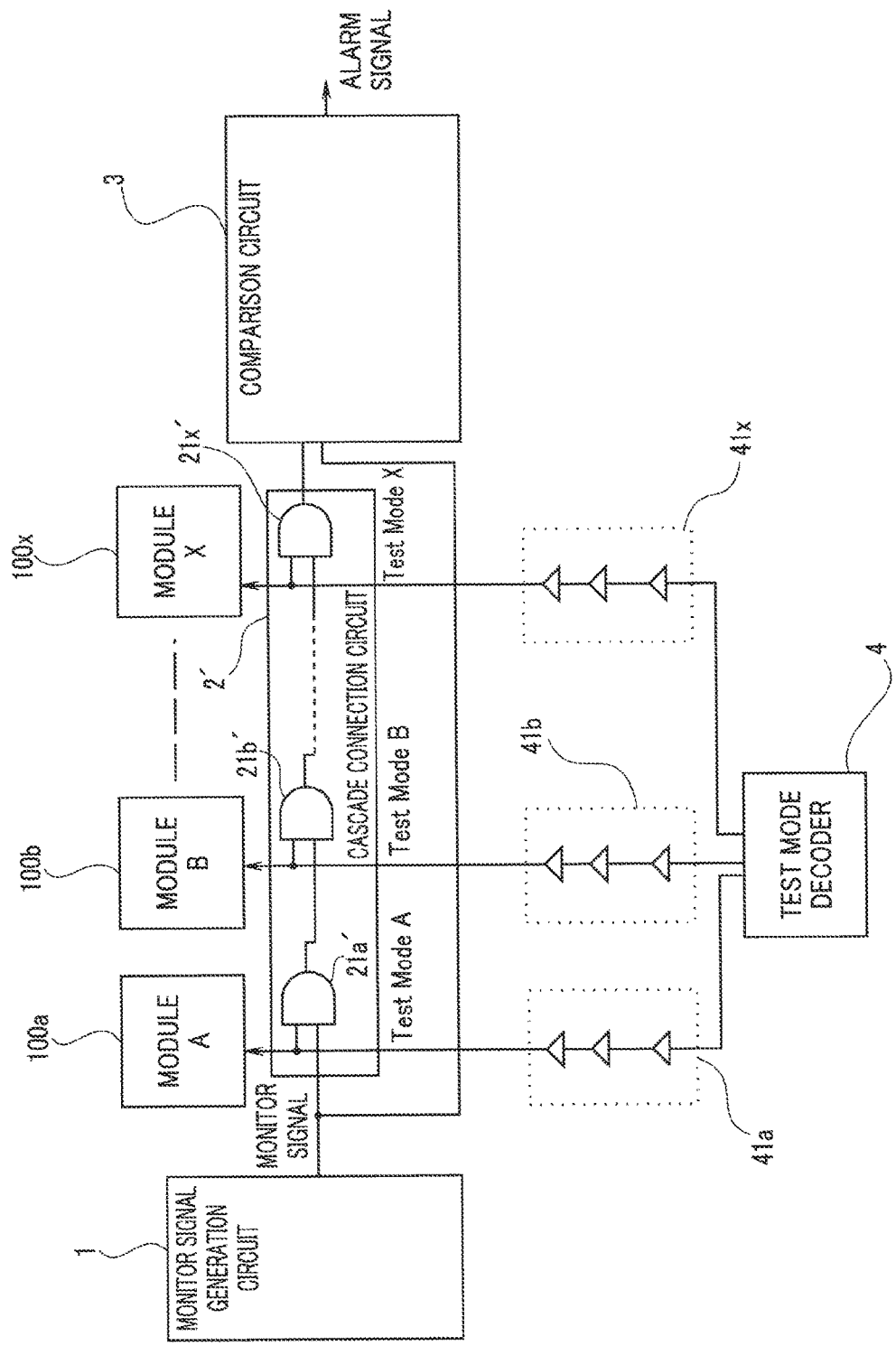
FIG. 6 is a schematic block diagram illustrating a configuration of another failure detection circuit of the third embodiment.

FIG. 6 is a schematic block diagram illustrating a configuration of a modified example of the failure detection circuit according to the third embodiment. As described in the second embodiment, also in the case of the cascade connection circuit 2' in which the AND circuit 21' is disposed in place of the OR circuit 21, the cascade connection circuit 2' can be laid out in the vicinity of the modules 100a, 100b, . . . , 100x. Therefore, because the repeat buffers 41a, 41b, . . . , 41x are disposed between the test mode decoder 4 and the cascade connection circuit 2', it is possible to also detect a failure of a wiring path (including the repeat buffers 41a, 41b, . . . , 41x) from the test mode decoder 4 to the module 100 in addition to a failure of the test mode signal and a failure of the AND circuit at the failure detection circuit.

Each "unit" in the present specification is a conceptual expression corresponding to each function in the embodiment, and does not always correspond to specific hardware or a software routine on a one-to-one basis. Therefore, in the present specification, the embodiment has been described assuming a virtual circuit block (unit) having each function of the embodiment.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A failure detection circuit comprising:
a monitor signal generation circuit configured to generate a monitor signal to be used to sense failures of a plurality of test mode signals to be respectively input to a plurality of modules;
a cascade connection circuit including a plurality of failure sensing circuits and configured to sense a failure of each of the test mode signals; and
a comparison circuit configured to compare an output signal from the cascade connection circuit with the monitor signal to determine whether or not a failure exists,
wherein, in the cascade connection circuit, the plurality of failure sensing circuits are connected in cascade, and the monitor signal is input to one of the failure sensing circuits in a first stage.

2. The failure detection circuit according to claim 1, wherein each of the failure sensing circuits is configured with an OR circuit or an AND circuit.

3. The failure detection circuit according to claim 2, wherein, when the module is in a normal operation state, the test mode signal is a low-level fixed signal, and each of the plurality of failure sensing circuits is the OR circuit.

4. The failure detection circuit according to claim 3, wherein the monitor signal periodically and repeatedly switches between a high level and a low level.

5. The failure detection circuit according to claim 4, further comprising:
a test mode decoder configured to generate the test mode signal,
wherein a plurality of buffers are disposed at intermediate portions of wirings connecting the test mode decoder and the plurality of failure sensing circuits.

6. The failure detection circuit according to claim 2,
wherein, when the module is in a normal operation state, the test mode signal is a high-level fixed signal, and each of the plurality of failure sensing circuits is the AND circuit.

7. The failure detection circuit according to claim 6,
wherein the monitor signal periodically and repeatedly switches between a high level and a low level.

8. The failure detection circuit according to claim 7, further comprising a test mode decoder configured to generate the test mode signal,
wherein a plurality of buffers are disposed at intermediate portions of wirings connecting the test mode decoder and the plurality of failure sensing circuits.

9. The failure detection circuit according to claim 1, further comprising:
a test mode decoder configured to generate the test mode signal,
wherein a plurality of buffers are disposed at intermediate portions of wirings connecting the test mode decoder and the plurality of failure sensing circuits.

10. A failure detection system comprising:
a monitor signal generation circuit configured to generate a monitor signal which periodically and repeatedly switches between a high level and a low level;
a cascade connection circuit including a plurality of failure sensing circuits configured to, for a plurality of test mode signals to be respectively input to a plurality of modules, sense a failure of each of the test mode signals, the plurality of failure sensing circuits being connected in cascade; and
a comparison circuit configured to compare an output signal from the cascade connection circuit with the monitor signal to determine whether or not a failure exists,
wherein the monitor signal is input to one of the failure sensing circuits in a first stage of the cascade connection circuit, and, in a case where output from the comparison circuit repeatedly switches between a high level and a low level, a failure of each of the test mode signals is sensed.

11. The failure detection system according to claim 10, further comprising:
a test mode decoder configured to generate the test mode signals,
wherein a plurality of buffers are disposed at intermediate portions of wirings connecting the test mode decoder and the plurality of failure sensing circuits.

12. The failure detection system according to claim 10,
wherein, when the module is in a normal operation state, the test mode signals are low-level fixed signals, and the plurality of failure sensing circuits are OR circuits.

13. The failure detection system according to claim 12,
wherein, in a case where output from the comparison circuit has a same waveform as a waveform of the monitor signal or in a case where the output from the comparison circuit has a same cycle and a same phase as a cycle and a phase of the monitor signal and has an opposite value to a value of the monitor signal, failures of the test mode signals are sensed.

14. The failure detection system according to claim 10,
wherein, when the module is in a normal operation state, the test mode signals are high-level fixed signals, and the plurality of failure sensing circuits are AND circuits.

15. The failure detection system according to claim 14,
wherein, in a case where output of the comparison circuit has a same waveform as a waveform of the monitor signal or in a case where the output from the comparison circuit has a same cycle and a same phase as a cycle and a phase of the monitor signal and has an opposite value to a value of the monitor signal, failures of the failure sensing circuits are sensed.

16. A failure detection method comprising:
generating a monitor signal which periodically and repeatedly switches between a high level and a low level;
for a plurality of test mode signals to be respectively input to a plurality of modules, inputting the monitor signal to one of failure sensing circuits in a first stage of a cascade connection circuit which includes the failure sensing circuits each configured to sense a failure of each of the test mode signals, and in which the plurality of failure sensing circuits are connected in cascade; and
sensing a failure of each of the test mode signals in a case where an alarm signal obtained by taking an exclusive OR of an output signal from the cascade connection circuit and the monitor signal periodically and repeatedly switches between a high level and a low level.

17. The failure detection method according to claim 16,
wherein, when the module is in a normal operation state, the test mode signals are low-level fixed signals, and the plurality of failure sensing circuits are OR circuits.

18. The failure detection method according to claim 17,
wherein, in a case where output from the comparison circuit has a same waveform as a waveform of the monitor signal or in a case where the output from the comparison circuit has a same cycle and a same phase as a cycle and a phase of the monitor signal and has an opposite value to a value of the monitor signal, failures of the test mode signals are sensed.

19. The failure detection method according to claim 16,
wherein, when the module is in a normal operation state, the test mode signals are high-level fixed signals, and the plurality of failure sensing circuits are AND circuits.

20. The failure detection method according to claim 19,
wherein, in a case where the alarm signal has a same waveform as a waveform of the monitor signal or in a case where the output from the comparison circuit has a same cycle and a same phase as a cycle and a phase of the monitor signal and has an opposite value to a value of the monitor signal, failures of the failure sensing circuits are sensed.

* * * * *